US007851709B2

(12) United States Patent
Cheng

(10) Patent No.: US 7,851,709 B2
(45) Date of Patent: Dec. 14, 2010

(54) MULTI-LAYER CIRCUIT BOARD HAVING GROUND SHIELDING WALLS

(75) Inventor: Hung-Hsiang Cheng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 620 days.

(21) Appl. No.: 11/620,444

(22) Filed: Jan. 5, 2007

(65) Prior Publication Data

US 2007/0221405 A1 Sep. 27, 2007

(30) Foreign Application Priority Data

Mar. 22, 2006 (TW) ............................. 95109780 A

(51) Int. Cl.
*H05K 1/11* (2006.01)

(52) U.S. Cl. ....................... 174/265; 174/261; 174/262; 174/51; 174/255; 174/394; 361/748; 361/777; 361/780; 361/792; 361/794

(58) Field of Classification Search ......... 174/261–266, 174/51, 255, 386, 394; 361/792, 794, 748, 361/777, 780
See application file for complete search history.

(56) References Cited

U.S. PATENT DOCUMENTS 4,368,503 A * 1/1983 Kurosawa et al. ........... 361/792
4,845,311 A * 7/1989 Schreiber et al. .............. 174/36
5,122,475 A * 6/1992 Heckaman et al. .......... 438/107
5,160,905 A * 11/1992 Hoang ........................ 333/204
5,272,600 A * 12/1993 Carey ......................... 361/792
5,294,897 A * 3/1994 Notani et al. ................. 333/33
5,308,250 A * 5/1994 Walz ........................... 439/63
5,372,872 A 12/1994 Funada et al.
5,519,363 A * 5/1996 Boudreau et al. .............. 333/1
5,639,989 A * 6/1997 Higgins, III ................ 174/386
5,677,515 A * 10/1997 Selk et al. ................... 174/255
5,917,388 A * 6/1999 Tronche et al. ............. 333/246
6,000,130 A * 12/1999 Chang et al. .................. 29/852
6,045,208 A * 4/2000 Hirahara et al. ............... 347/10
6,072,375 A * 6/2000 Adkins et al. .................. 333/1
6,091,027 A * 7/2000 Hesselbom et al. ......... 174/255
6,307,259 B1 * 10/2001 Asada et al. ................ 257/691
6,437,669 B1 * 8/2002 Welstand et al. ............ 333/246
6,444,922 B1 * 9/2002 Kwong ....................... 174/261
6,466,112 B1 * 10/2002 Kwon et al. ................ 333/243
6,570,464 B1 * 5/2003 Tanabe et al. ................. 333/34
6,639,487 B1 * 10/2003 Salmela et al. ................ 333/34
6,677,248 B2 * 1/2004 Kwon et al. ................ 438/723
6,707,682 B2 * 3/2004 Akiba et al. ................ 361/763
6,753,253 B1 * 6/2004 Takahashi et al. ........... 438/676
6,774,748 B1 * 8/2004 Ito et al. ..................... 333/247
6,818,477 B2 * 11/2004 Veitschegger et al. ....... 438/122
6,909,333 B2 * 6/2005 Aikawa et al. ................ 331/56
6,933,450 B2 * 8/2005 Okumichi et al. ........... 174/264

(Continued)

*Primary Examiner*—Xiaoliang Chen
(74) *Attorney, Agent, or Firm*—J.C. Patents

(57) ABSTRACT

A circuit board includes a plurality of signal lines and a plurality of shielding walls. The shield walls are disposed between the signal lines. Each shield wall includes an upper surface, a lower surface, a rectangular groove, a first metal layer and a second metal layer. The lower surface is opposite to the upper surface. The rectangular groove extends from the upper surface to the lower surface. The first metal layer is disposed on the upper surface. The second metal layer is disposed in the rectangular groove and electrically connected to the first metal layer.

13 Claims, 5 Drawing Sheets

100
120
112
L1=L2
5
5
114

U.S. PATENT DOCUMENTS 6,949,992 B2 * 9/2005 Sweeney et al. ............ 333/246
6,965,072 B2 * 11/2005 Gustafsson et al. ......... 174/359
6,987,307 B2 * 1/2006 White et al. ................ 257/508
7,034,640 B2 * 4/2006 Nguyen et al. .............. 333/238
7,151,420 B2 * 12/2006 Brunker et al. ................. 333/4
7,187,254 B2 * 3/2007 Su et al. ..................... 333/189
7,193,490 B2 * 3/2007 Shimoda ..................... 333/246
7,199,504 B2 * 4/2007 Komuro et al. ............. 310/320
7,202,755 B2 * 4/2007 Tabatabai ...................... 333/4
7,400,222 B2 * 7/2008 Kwon et al. ................ 333/243
7,404,250 B2 * 7/2008 Cheng et al. .................. 29/852
7,405,477 B1 * 7/2008 Tao et al. .................... 257/728
7,432,776 B2 * 10/2008 Kwong et al. .................. 333/1
7,498,973 B2 * 3/2009 Tevs et al. ................... 342/104
7,535,325 B2 * 5/2009 Mueller-Fiedler et al. ... 333/262
2002/0130739 A1 * 9/2002 Cotton ....................... 333/238
2003/0071700 A1 * 4/2003 Kwon et al. ................ 333/243
2003/0089522 A1 * 5/2003 Dances ....................... 174/260
2003/0097806 A1 * 5/2003 Brown ....................... 52/220.1
2003/0169133 A1 * 9/2003 Torigoe et al. .............. 333/238
2003/0213619 A1 * 11/2003 Denzene et al. ............. 174/261
2004/0040739 A1 * 3/2004 Yoshimura et al. .......... 174/255
2005/0045376 A1 * 3/2005 Lee et al. .................... 174/255
2005/0146390 A1 * 7/2005 Baek ........................... 333/33
2005/0156692 A1 * 7/2005 Dove et al. .................. 333/243
2006/0226928 A1 * 10/2006 Henning et al. ............... 333/33

* cited by examiner

MULTI-LAYER CIRCUIT BOARD HAVING GROUND SHIELDING WALLS

CROSS-REFERENCE TO RELATED APPLICATION

This application claims the priority benefit of Taiwan application serial no. 95109780, filed Mar. 22, 2006. All disclosure of the Taiwan application is incorporated herein by reference.

BACKGROUND OF THE INVENTION

1. Field of the Invention

The present invention relates to a multi-layer circuit board; more particularly to a multi-layer circuit board having a plurality of ground shielding walls.

2. Description of Related Art

Due to the market demand for the size of digital electronic products being smaller and the speed faster, the design of high speed signal circuit board has been increasingly emphasized. Please refer to FIG. 1 which illustrates a four-layer circuit board as an example. The first layer of the multi-layer circuit board 10 is used as a signal layer 12 for mounting device; the second layer is a ground layer 14; the third layer is a power layer 16; and the fourth layer is a signal layer for welding 18. The first, second, third and fourth layer are covered with dielectric layers 20 respectively to separate each layer. In comparison with the power layer 14, the ground layer 12 has better noise-shielding effect. Therefore, all the high speed wirings must be disposed on the signal layer 12 for mounting device.

However, due to the increase of operation frequency and processing speed of electronic products, the above structure for the high-speed signal circuit board can no longer meet the need. In designing a higher-speed signal circuit board, it is getting more important to control noise interference. Please refer to FIGS. 2*a* and 2*b*. Another type of high speed signal circuit board 30 prevents the noise interference by using guard traces, such as the ground-shielding-type ground lines 42, to encircle near the high speed signal lines 32. The ground lines 42 further have plated through holes 44 to be connected to the ground layer 34 so as to prevent the poor effect caused by resonance, thereby, preventing the reducing of the signal quality.

For example, please refer to FIG. 3, U.S. Pat. No. 5,372,872, entitled “Multiplayer Printed Circuit Board” which discloses a multi-layer printed circuit board 50 having a through hole 57 passing through the substrate 52 and the pre-preg 54 and electrically connecting to a ground pad 58. The plated through hole 57 is disposed at the intersect point of the plaid-weaved net or within the net. The plaid-weaved net is used as a ground layer of the signal interconnection layer 56 so as to reduce noise interference or cross talk.

However, the above conventional plated through holes are rounded ones. The ground shielding body in the through holes is formed by a plurality of separated cylinders which can not efficiently shield the magnetic field or the inductance of the electric field generated by the high-speed signal lines. Furthermore, the ground shielding cylinders formed by the above conventional plated through holds are likely to generate inductance effect, leading to the poor effect caused by additional resonance.

In addition, the diameter of the conventional plated through hole is usually 100~200 μm, and the line width is usually 70~80 μm. To dispose more plated through holes, the guard traces (the ground lines) are often made more elongated. However, if the ground lines are too long the resonance could occur, decreasing the signal transmission quality.

Therefore, to solve the aforesaid problem, there is a need to provide a multi-layer circuit board.

SUMMARY OF THE INVENTION

The present invention is directed to providing a multi-layer circuit board having a plurality of ground shielding walls so as to effectively shield inductance effect of the electric field.

The present invention provides a multi-layer circuit board having a plurality of signal lines and a plurality of shielding walls. The shielding walls are disposed between the signal lines. Each shielding wall comprises an upper surface, a lower surface, a groove, a first metal layer and a second metal layer. The lower surface is opposite to the upper surface. The groove extends from the upper surface to the lower surface. The plurality of signal lines and the groove of each shielding wall are arranged parallel to one another. The first metal layer is disposed on the upper surface. The second metal layer is disposed within the groove and electrically connects to the first metal layer.

The groove is either a through groove or a non-through groove. The shielding wall has a middle metal layer disposed between the upper surface and the lower surface. The second metal layer is used to electrically connect the first metal layer to the middle metal layer.

In the present invention, the ground shielding body formed by the shielding walls is wall-shaped which can improve the conventional ground shielding body formed by a plurality of separated cylinders; and thereby, effectively shielding inductance effect of the electric field. Moreover, the shielding walls of the present invention can improve the conventional ground shielding cylinders which are formed by the plated through holes, and thereby forming the ground shielding wall-shaped body to lower inductance so that the poor effect of additional resonance can be prevented. Additionally, the grooves of the shielding walls of the present invention can solve the conventional problem of the ground lines being too long, and thereby further preventing the resonance problem caused by the longer ground lines which decrease the signal transmission quality.

In order to make aforementioned and other objects, features and advantages of the present invention comprehensible, preferred embodiments accompanied with figures are described in detail below. It is to be understood that both the foregoing general description and the following detailed description are exemplary, and are intended to provide further explanation of the invention as claimed.

DESCRIPTION OF EMBODIMENTS

Figure 1:
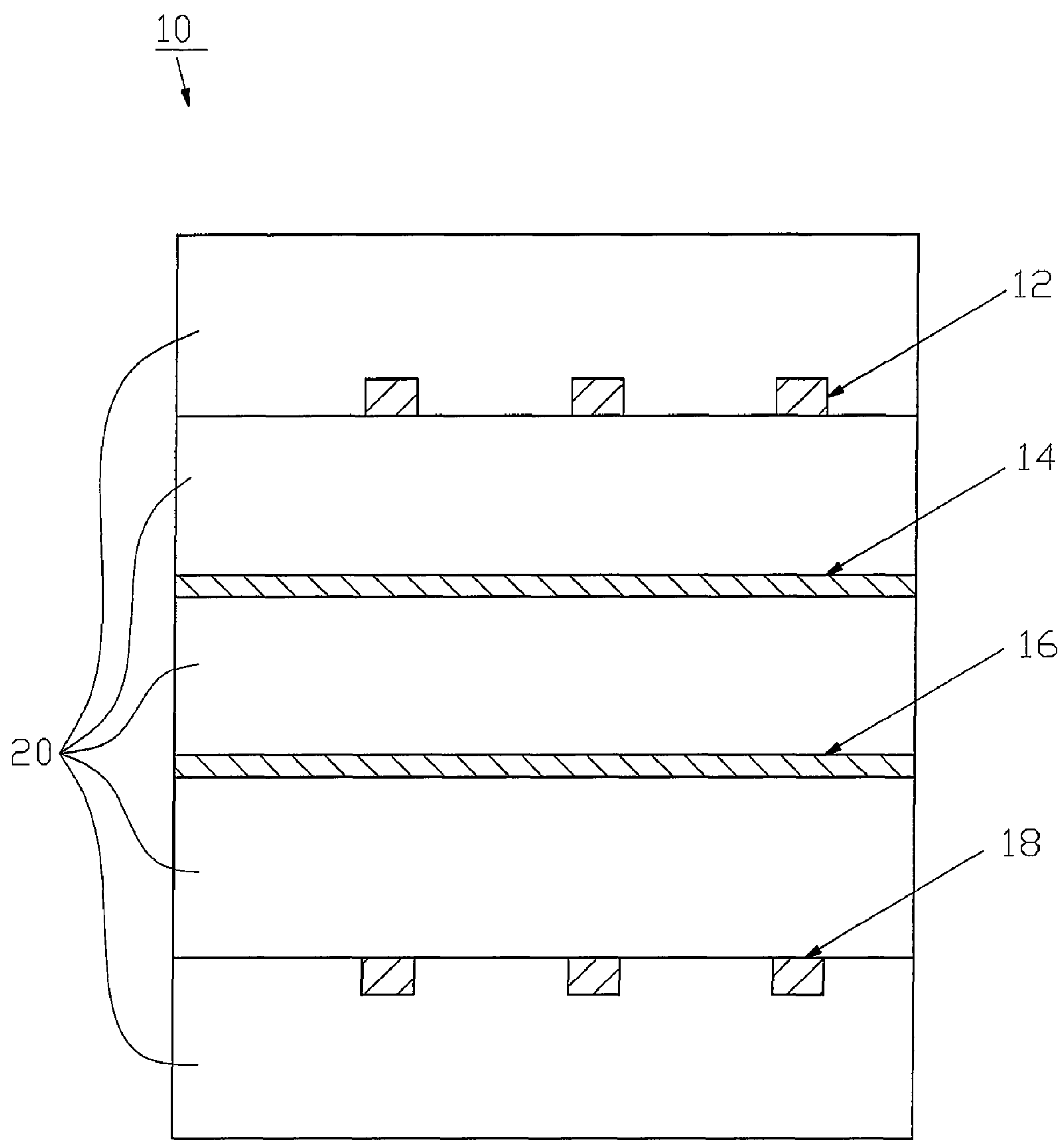
FIG. 1 is a schematic cross-sectional view showing a conventional multi-layer circuit board.
Figure 2A:
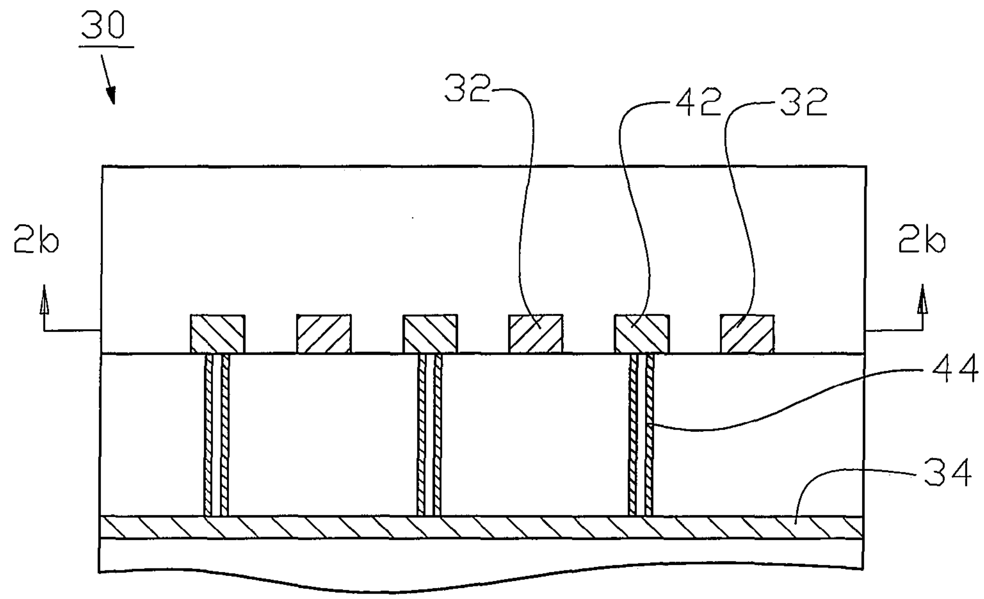
FIG. 2*a* is a schematic cross-sectional view showing another conventional multi-layer circuit board.
Figure 2B:
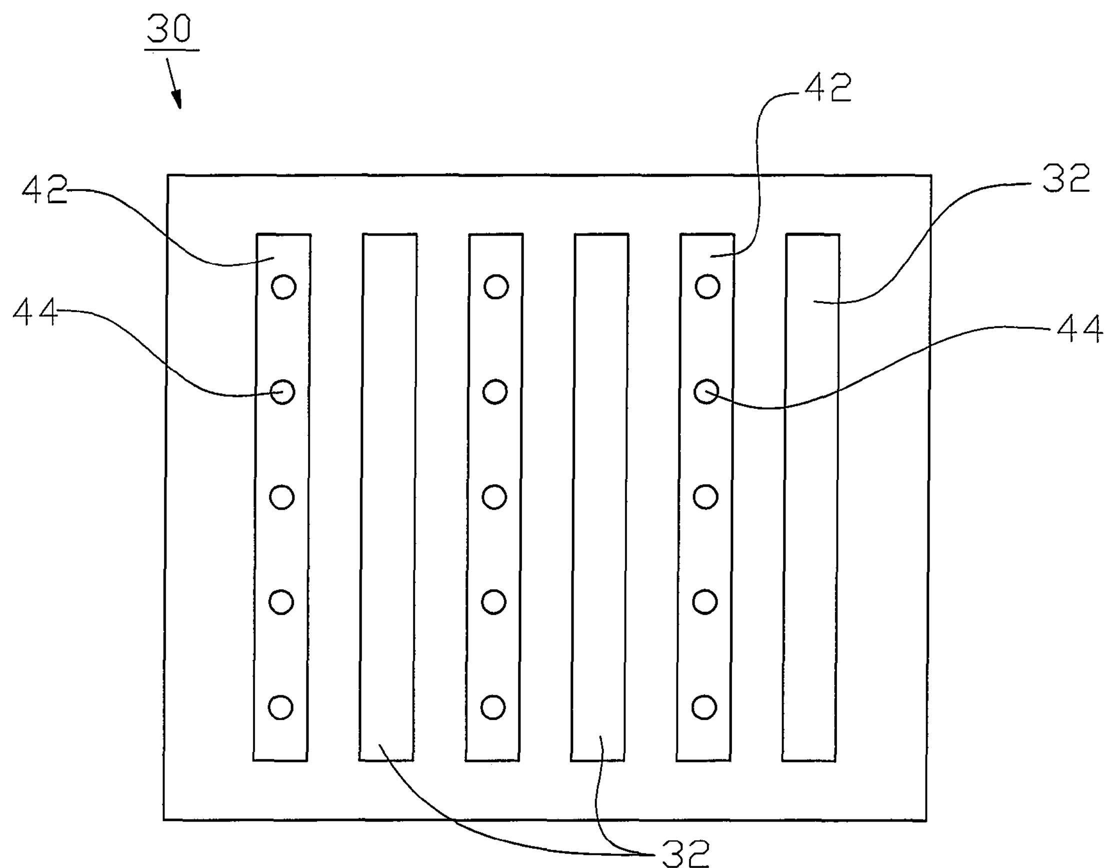
FIG. 2*b* is a schematic diagram showing the multi-layer circuit board along the sectioning line 2*b*-2*b* in FIG. 2*a*.
Figure 3:
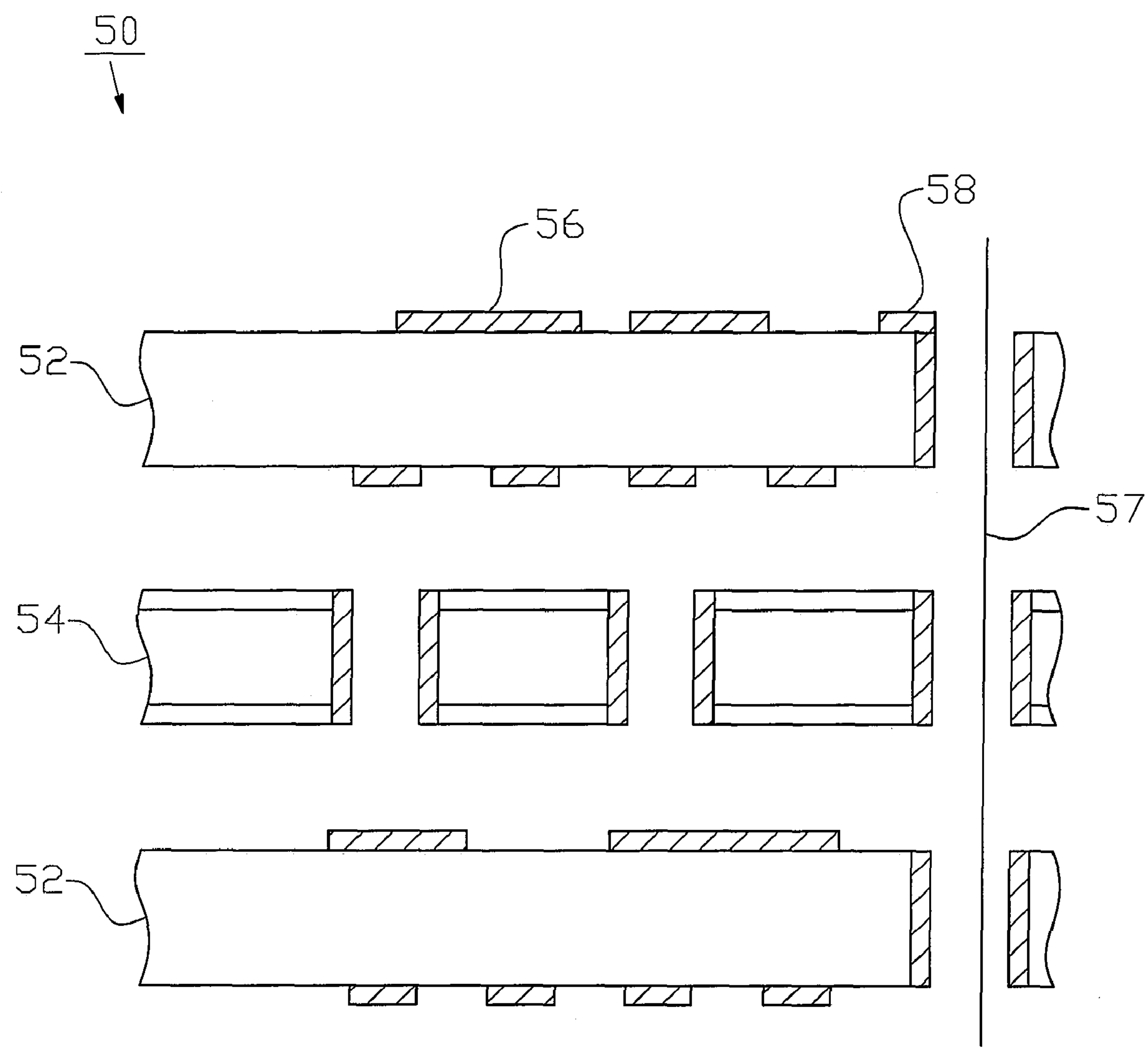
FIG. 3 is a schematic cross-sectional view showing another conventional multi-layer circuit board.
Figure 4:
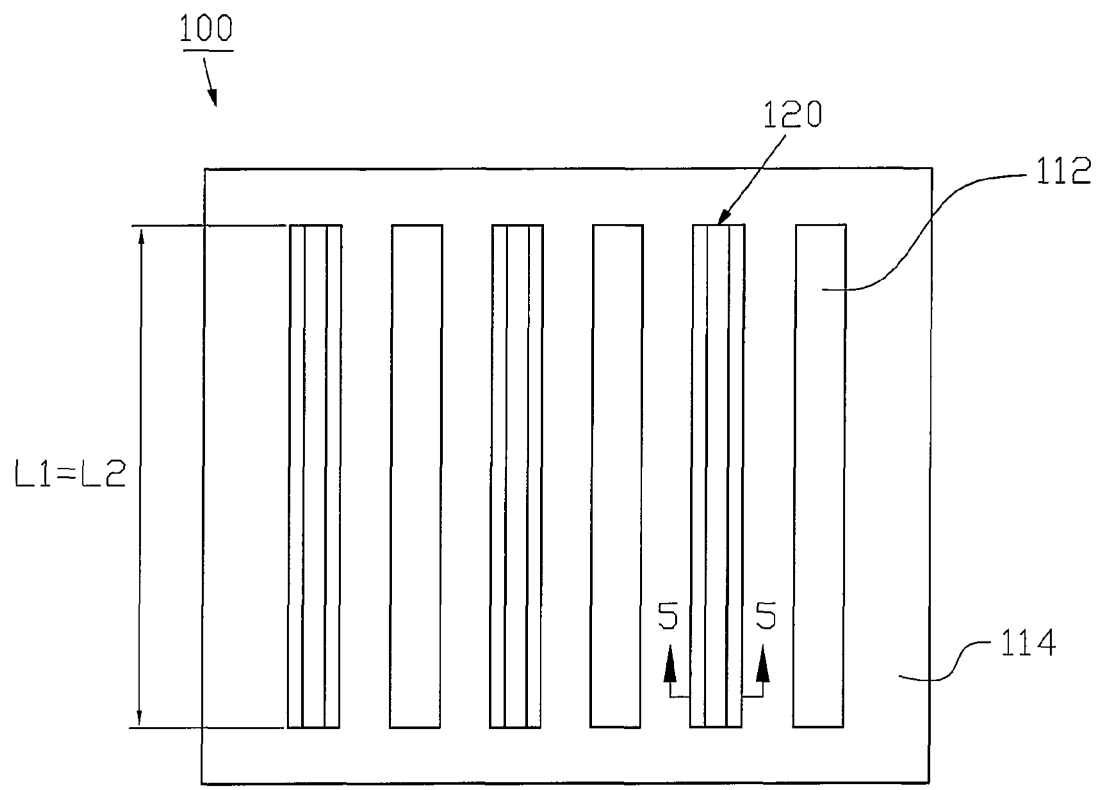
FIG. 4 is a schematic diagram showing the multi-layer circuit board according to the first embodiment of the present invention.
Figure 5:
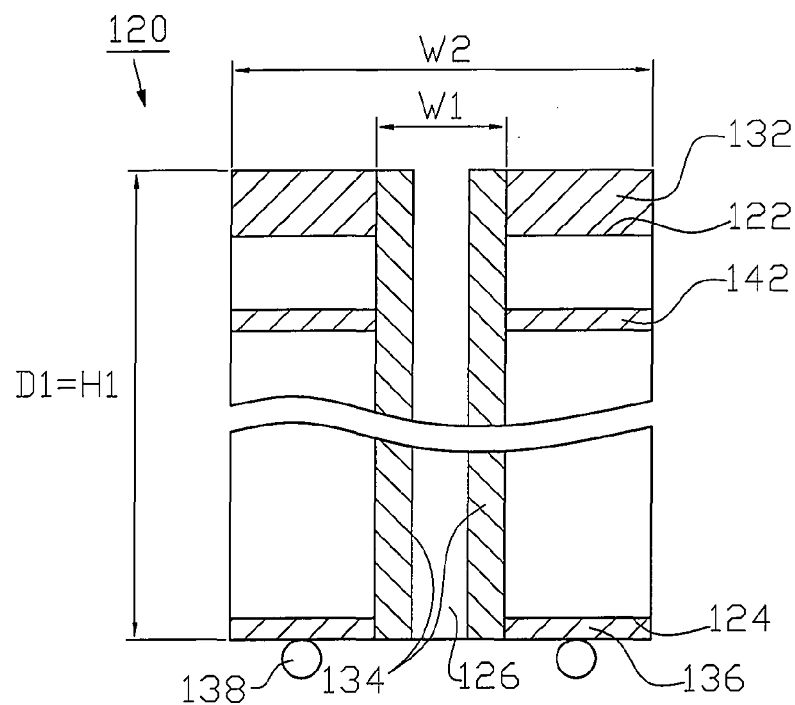
FIG. 5 is a magnified cross-sectional view showing the multi-layer circuit board along the sectioning line 5-5 in FIG. 4.

FIG. 4 shows the multi-layer circuit board 100 according to the first embodiment of the present invention. The multi-layer circuit board 100 includes a plurality of signal lines 112 and a plurality of shielding walls 120 disposed between the signal lines 112. The multi-layer circuit board 100 also includes a plurality of dielectric layers 114 which are used to separate each layer and cover the signal lines 112 and a plurality of shielding walls 120. FIG. 5 shows that each shielding wall 120, such as ground shielding wall, comprises an upper surface 122, a lower surface 124 and a groove 126, wherein the groove 126 can be rectangle, for example. The lower surface 124 is opposite to the upper surface 122. The groove 126 is a through groove which extends from the upper surface 122 toward the lower surface 124; the depth (D1) of the groove is approximately equivalent to the height (H1) of the shielding wall 120. The width (W1) of the groove 126 is smaller than the width (W2) of the shielding wall 120. As shown in FIG. 4, the length (L1) of the groove 126 is approximately equivalent to the length (L2) of the shielding wall 120. The groove 126 is formed by laser cutting or mechanical process.

As shown in FIG. 5, a first metal layer 132 is disposed on the upper surface 122 and a third metal layer 136 is disposed on the lower surface 124. A second metal layer 134 is disposed in the groove 126 which is used to electrically connect the first metal layer 132 to the third metal layer 136. The shielding wall 120 comprises a plurality of conductive contacts 138, such as solder ball, which are disposed on the third metal layer 136. The conductive contacts 138 are used to electrically connect to another outer circuit board (not shown) or an outer electronic device (not shown.) The first metal layer 132, the second metal layer 134 and third metal layer 136 can be made of copper.

The shielding wall 120 also comprises a middle metal layer 142 disposed between the upper surface 122 and the lower surface 124 and electrically connecting to the second metal layer 134. The middle metal layer 142 can be made of copper. The first metal layer 132 is a ground line of a ground-shielding type or a power line of a power-shielding type. Corresponding to the first metal layer 132, when the first metal layer 132 is a ground-shielding-typed ground line, the metal layer 142 is a ground layer. When the first metal layer 132 is a ground-shielding-typed power line, the middle metal layer 142 is a power layer. In the present embodiment, the drawings only show the examples of the first metal layer being a ground-shielding-typed first ground line and the middle metal layer being a ground layer. It is apparent to those skilled in the art that the present invention is also disclosed in similar figures of another embodiment, indicating that the first metal layer is a power-shielding-typed power line and the middle metal layer is a power layer In the present invention, the ground shielding body formed by the shielding walls is wall-shaped which can improve the conventional ground shielding body formed by a plurality of separated cylinders; and thereby, effectively shielding inductance effect of the electric field. Moreover, the shielding walls of the present invention can improve the conventional ground-shielding cylinders formed by the plated through holes, and thereby forming the ground-shielding wall-shaped body to reduce inductance so that the poor effect of additional resonance can be prevented. Furthermore, the shielding walls of the present invention are ground-typed, thus, it provides better return current path and effectively reduces inductance effect. Additionally, the grooves of the shielding walls of the present invention can solve the conventional problem of the ground lines being too long, and thereby further preventing the resonance problem caused by the longer ground lines which decrease the signal transmission quality.

Figure 6:
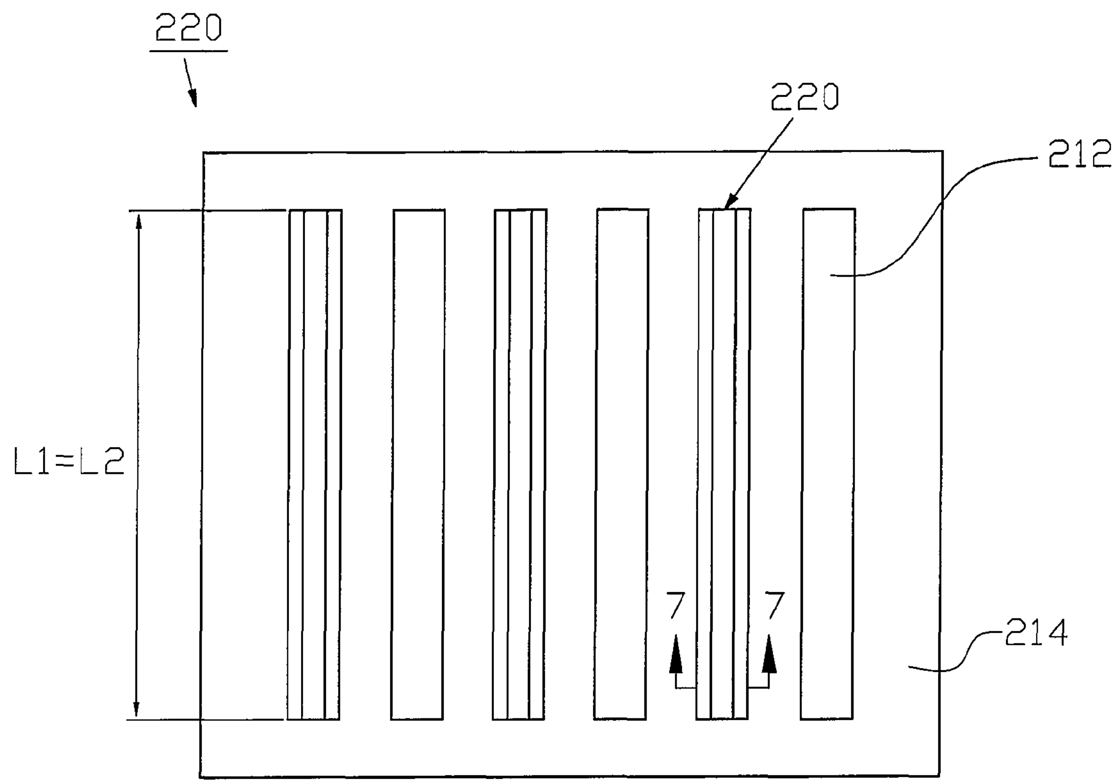
FIG. 6 is a schematic diagram showing the multi-layer circuit board according to the second embodiment of the present invention.
Figure 7:
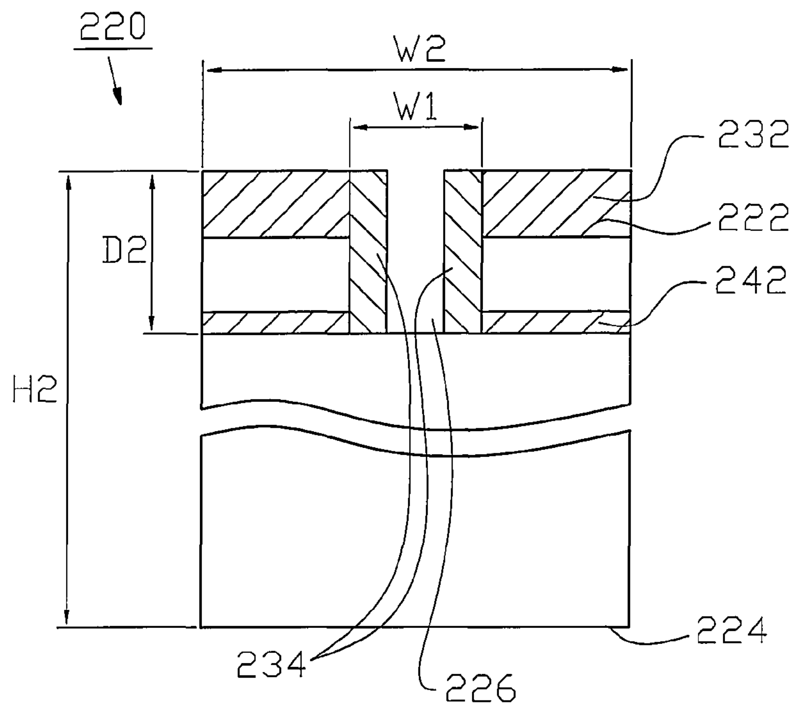
FIG. 7 is a magnified cross-sectional view showing the multi-layer circuit board along the sectioning line 7-7 in FIG. 6.

FIG. 6 shows the multi-layer circuit board 200 according to the second embodiment of the present invention. The multi-layer circuit board 200 has a plurality of signal lines 212 and a plurality of shielding walls 220 disposed between the signal lines 212. The multi-layer circuit board 200 also has a plurality of dielectric layers 214 which are used to separate each layer and cover the signal lines 212 and a plurality of shielding walls 220. FIG. 7 shows that each shielding wall 220, such as a ground shielding wall, comprises an upper surface 222, a lower surface 224 and a groove 226. The lower surface 224 is opposite to the upper surface 222. The groove 226 is a non-through groove which extends from the upper surface 222 toward the lower surface 224. The depth (D2) of the groove is approximately smaller than the height (H2) of the shielding wall 220. The width (W1) of the groove 226 is smaller than the width (W2) of the shielding wall 220. As indicated in FIG. 6, the length (L1) of the groove 226 is approximately equivalent to the length (L2) of the shielding wall 220. The groove 226 is formed by laser cutting or mechanical process.

As shown in FIG. 7, a first metal layer 232 is disposed on the upper surface 222 and a middle metal layer 242 is disposed between the upper surface 222 and the lower surface 224. A second metal layer 234 is disposed inside the groove 226 which is used to electrically connect the first metal layer 232 to the middle metal layer 242. The first metal layer 232, the second metal layer 234 and the middle metal layer 242 are made of copper. The first metal layer 232 is a ground line of a ground-shielding type or a power line of a power-shielding type. Corresponding to the first metal layer 232, when the first metal layer 232 is a ground-shielding-typed ground line, the middle metal layer 242 is a ground layer. When the first metal layer 232 is a ground-shielding-typed power line, the middle metal layer 242 is a power layer. In the present embodiment, the drawings only show the examples of the first metal layer being a ground-shielding-typed first ground line and the middle metal layer being a ground layer. It is apparent to those skilled in the art that the present invention is also disclosed in similar figures of another embodiment, indicating that the first metal layer is a power-shielding-typed first power line and the middle metal layer is a power layer In the present invention, the ground shielding body formed by the shielding walls is wall-shaped which can improve the conventional ground shielding body formed by a plurality of separated cylinders; and thereby, effectively shielding inductance effect of the electric field. Moreover, the shielding walls of the present invention can improve the conventional ground-shielding cylinders formed by the plated through holes, and thereby forming the ground-shielding wall-shaped body to reduce inductance so that the poor effect of additional resonance can be prevented. Furthermore, the shielding walls of the present invention are ground-typed, thus, it provides better return current path to effectively reduce inductance effect. Additionally, the grooves of the shielding walls of the present invention can solve the conventional problem of the ground line being too long, thereby, further preventing the resonance problem caused by the longer ground lines which decrease the signal transmission quality.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A circuit board, comprising:

a plurality of dielectric layers;

a plurality of signal lines; and a plurality of shielding walls, separated by the plurality of dielectric layers and disposed between the signal lines, wherein each shielding wall comprises:

an upper surface;

a lower surface opposite to the upper surface;

a groove extending from the upper surface toward the lower surface, wherein each of the plurality of signal lines extends along a longitudinal direction parallel to a longitudinal axis of the groove of each shielding wall without extending within the groove of each shielding wall;

a first metal layer disposed on the upper surface, wherein the first metal layer and the plurality of signal lines are located at a same layer;

a second metal layer disposed inside the groove and electrically connecting to the first metal layer;

a middle metal layer disposed between the upper surface and the lower surface, wherein the second metal layer electrically connects the first metal layer to the middle metal layer; and wherein the first metal layer is a ground shielding layer or a power shielding layer.

2. The circuit board of claim 1, wherein the groove is a through groove which extends from the upper surface toward the lower surface.

3. The circuit board of claim 2, wherein the shielding wall further comprises a third metal layer disposed on the lower surface, wherein the second metal layer electrically connects the first metal layer to the third metal layer.

4. The circuit board of claim 3, wherein the shielding wall further comprises a plurality of conductive contacts disposed on the third metal layer.

5. The circuit board of claim 2, wherein the depth of the groove is approximately equivalent to the height of the shielding wall.

6. The circuit board of claim 1, wherein the groove is a non-through groove.

7. The circuit board of claim 6, wherein the depth of the groove is smaller than the height of the shielding wall.

8. The circuit board of claim 1, wherein the first metal layer is the ground-shield-typed ground line and the middle metal layer is a ground layer.

9. The circuit board of claim 1, wherein the first metal layer is the ground-shield-typed power line and the middle metal layer is a power layer.

10. The circuit board of claim 1, wherein the depth of the groove is approximately equivalent to the length of the shielding wall.

11. The circuit board of claim 1, wherein the width of the groove is smaller than the width of the shielding wall.

12. The circuit board of claim 1, wherein the groove is formed by laser cutting.

13. The circuit board of claim 1, wherein the groove is formed by mechanical process.

* * * * *